United States Patent [19]

Keller

[11] Patent Number: 4,696,716
[45] Date of Patent: Sep. 29, 1987

[54] APPARATUS FOR DOPING SEMICONDUCTOR RODS WITH SOLID DOPANTS

[75] Inventor: Wolfgang Keller, Munich, Fed. Rep. of Germany

[73] Assignee: Siemens Aktiengesellschaft, Berlin and Munich, Fed. Rep. of Germany

[21] Appl. No.: 865,218

[22] Filed: May 20, 1986

[30] Foreign Application Priority Data

May 20, 1985 [DE] Fed. Rep. of Germany ....... 3518073

[51] Int. Cl.⁴ ...................... C30B 13/10; C30B 13/12
[52] U.S. Cl. ................................. 156/605; 156/620; 156/DIG. 98; 156/DIG. 64; 118/900; 422/247; 422/250
[58] Field of Search ............... 156/605, 606, 620, 611, 156/DIG. 98, DIG. 97, 607, 608; 422/250, 247; 118/900

[56] References Cited

U.S. PATENT DOCUMENTS

| | | | |
|---|---|---|---|
| 3,908,586 | 9/1975 | Sporrer | 156/605 |
| 3,954,416 | 5/1976 | Keller | 156/620 |
| 4,270,972 | 6/1981 | Crouse | 156/620 |
| 4,556,448 | 2/1985 | Kim et al. | 156/620 |

FOREIGN PATENT DOCUMENTS 0140239 5/1985 European Pat. Off. .
1294425 4/1962 France .

Primary Examiner—Asok Pal
Attorney, Agent, or Firm—John Francis Moran

[57] ABSTRACT

Semiconductor rods are doped in a crucible-free, float-zone enclosure, by the introduction of dopant pellets into the float-zone. The dopant pellets are located in a hopper (7), mounted on the inside of the float-zone enclosure. The introduction of individual dopant pellets is controlled, through an actuating device (12), from the outside of the enclosure.

12 Claims, 7 Drawing Figures

APPARATUS FOR DOPING SEMICONDUCTOR RODS WITH SOLID DOPANTS

BACKGROUND OF THE INVENTION

This invention relates to apparatus for the doping of a semiconductor rod held inside a crucible free float-zone apparatus, and it relates, more particularly, to the introduction of dopant pellets into the localized float-zone, (produced in the semiconductor rod by an induction heating coil), with at least one hopper for introducing the dopant pellets, provided with an exit port, and with an outlet conduit connected to the exit port and directed at the float zone.

Typical conventional apparatus of this kind has been described in U.S. Pat. No. 4,270,972. The hopper for holding the dopant pellets is located external to the float-zone apparatus. The outlet conduit passes through the wall of the float-zone apparatus into the interior. Since zone melting is conducted either in a vacuum or in a protective gas, the hopper, arranged on the outside of the float-zone apparatus, must be vacuum tight and/or gas tight. The evacuation of the hopper, which must also take place prior to zone melting in a protective gas can of course, take place through the outlet conduit, but this is very inefficient due to the small cross-section of the outlet conduit. An additional exhaust tube, or larger cross-section, to the magazone would further complicate the apparatus.

SUMMARY OF THE INVENTION

An object of the present invention is to advance the development of apparatus of the foregoing described type, that will make possible, an improvement in both pumping speed and a simplification of construction.

This object is achieved primarily due to a reservoir of dopant material being located on the inside of the apparatus wherein the semiconductor rod including a localized float-zone is located. An arrangement is presented for controlling the operation of the hopper externally while employing gas seals to maintain the integrity of the enclosure. In addition, a plurality of hoppers may be utilized each individually controlled externally to introduce individual dopant pellets to the float-zone in a sequence as desired. Various mechanical arrangements are utilized for physically moving the dopant pellets. In one arrangement the dopant pellets are contained in a hopper while in other arrangements a sequence of dopant pellets are introduced to the float-zone in a predetermined externally controller manner.

BRIEF DESCRIPTION OF THE DRAWING

Features of the invention and additional objects of the invention will be more readily appreciated and better understood by reference to the following detailed description of various illustrative embodiments which should be considered in conjunction with the drawing.

DETAILED DESCRIPTION

Figure 1:
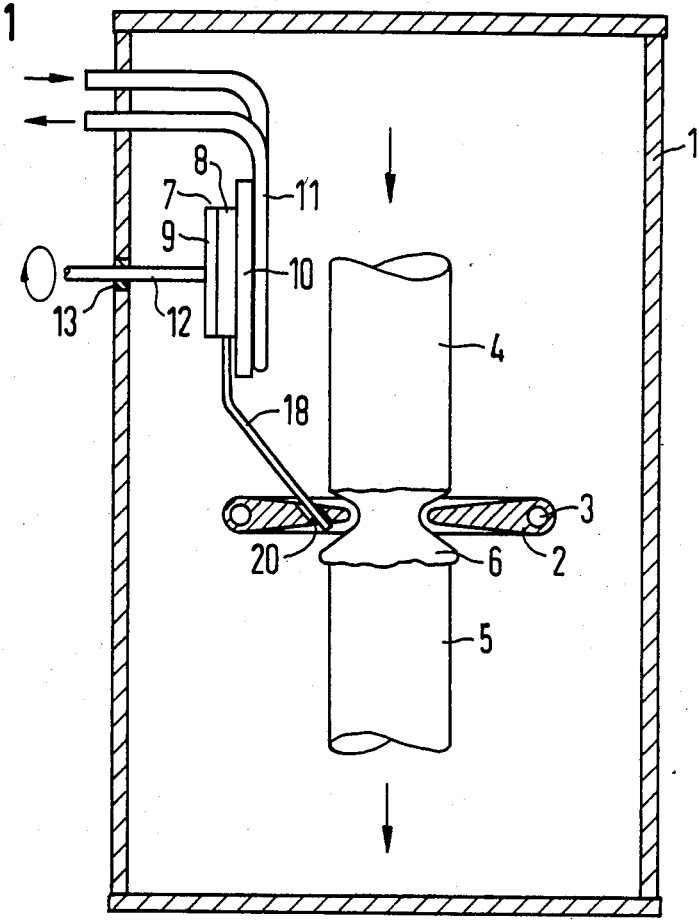
FIG. 1 is a cross-sectional view of float-zone apparatus including a hopper in accordance with a first illustrative embodiment of the invention.

The float-zone equipment of FIG. 1 includes a gas tight container 1, wherein the semiconductor rod 4, 5 is held in a manner allowing rotation and axial displacement. The attachment mechanism for providing this motion is not shown in the interest clarity. The semiconductor rod, a silicon rod for example, comprises a polycrystalline portion 4 and a monocrystalline portion 5. Portion 4 is melted in a conventional manner by means of the induction heating coil 2, so that a float zone 6 is formed.

Figure 2:
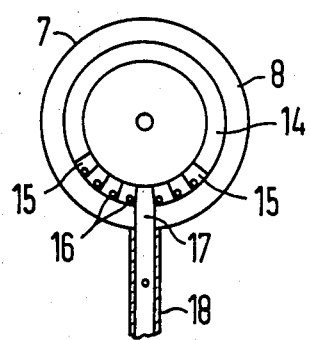
FIG. 2 is a top view depicting further details of a unit included in FIG. 1.

A hopper 7 for the introduction of dopant pellets is disposed inside the float-zone apparatus 1. This hopper is secured to the wall of the float-zone apparatus 1 by attachment means, not shown. In FIG. 2, hopper 7 has an exit port 17 which opens into an outlet conduit 18. The outlet conduit 18 is slanted downward at an angle and is directed at the melt zone 6. In FIG. 1, the end of the outlet conduit 18 is suitably positioned over the construction in the float-zone 6, produced by the action of the induction heating coil 2.

The hopper 7 includes a housing 8, sealed by means of a cover 9. A chambered wheel is located inside the housing having open chambers 15 along its perimeter, opening toward the perimeter. Each chamber 15, contains a dopant pill comprising either a pure doping material, for example indium or bismuth, or an alloy of the desired doping material with silicon. The chambered wheel is fastened to a shaft 12 which passes through the wall of the float-zone apparatus 1. The shaft 12 is sealed by means of seals 13 which may, for example, be a suitable commercially available O-ring or a number of O-rings. These are known, for example, to those skilled in the art under the trade name of SIMMERING O-rings.

A metallic heat protective shield 10, which can be cooled by means of a cooling coil 11, is suitably arranged between the hopper 7 and the semiconductor rod. The housing 8 and the cover 9 as well as the shaft 12 may also be made of metal, though it is recommended that the chambered wheel, at least, be made of a heat resisting plastic such as PTFE.

During the zone floating procedure, the shaft 12 is rotated in increments, corresponding to one chamber at a time, in accordance with a time program. One of dopant pellets 16 then falls through the outlet conduit 18, into the melt.

There the pellet melts and is taken up into the crystal lattice of the monocrystalline section 5 to an extent corresponding to its equilibrium segregation coefficient.

Depending on the spacing between the hopper and the float-zone, it may be recommended that an opening 20 be provided in the melting coil, at an angle to its horizontal plane, through which the end of the outlet conduit 18 passes. The melting coil may also be provided to include a radially running trough, for example of quartz, running inward at an angle.

Figure 3:
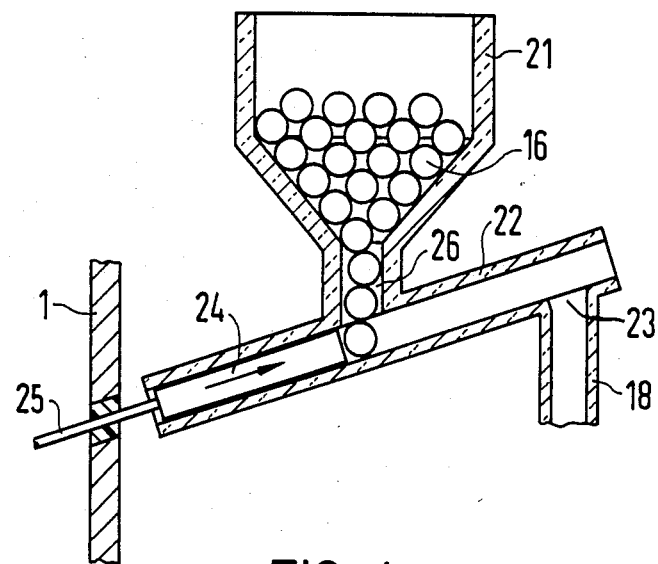
FIGS. 3 and 4 are cross-sectional views of further illustrative embodiments of hoppers demonstrating two characteristic positions of the feed mechanism.
Figure 4:
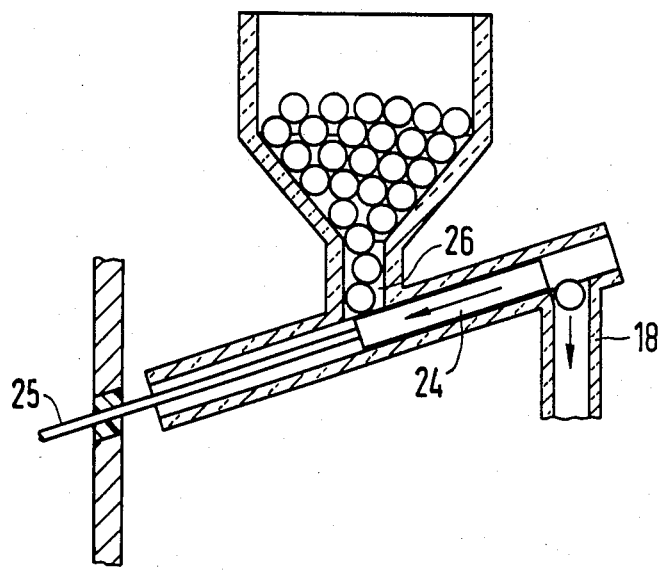

According to FIGS. 3 and 4 another version of the hopper includes a funnel 21 that is provided with a port 26. This port opens into a tube 22, that is at a slight angle to the horizontal of the apparatus. Funnel 21 and tube 22 may, for example, be made of quartz. The tube 22 is provided with an exit port on the under side of its upper end which opens into the outlet conduit 18. The lower end of the tube 22 is sealed with a piston which has an actuating rod 25 passing through the wall of apparatus 1. If the piston is positioned as demonstrated in FIG. 3, one of the dopant pellets 16 falls into the tube 22. The piston is then moved angularly upward in the direction of the arrow until the dopant pill 16 falls through the opening 23 into the outlet conduit 18. The length of the piston is such, that it closes the port 26 of the funnel 21, at the upper point of travel reversal. This phase is shown in FIG. 4. After the piston 24 is drawn back to the lower point of travel reversal an additional dopant pellet falls into the tube 22 and can be transported from there, after an allowed time, to the exit port 23.

Figure 5:
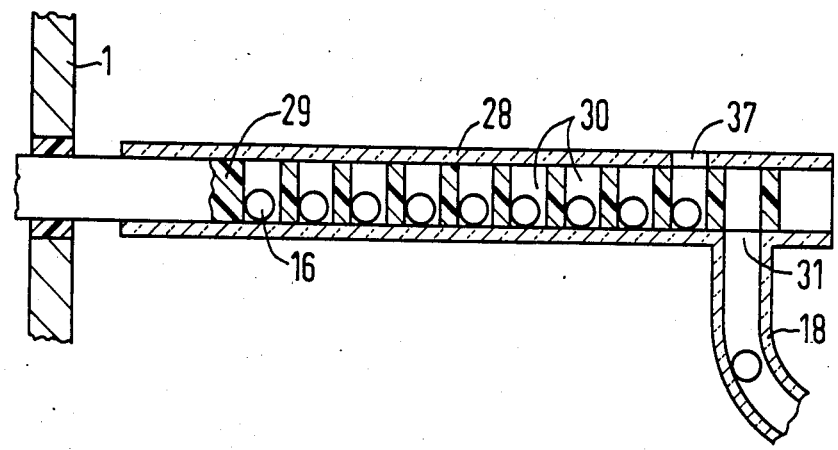
FIG. 5 is a cross-sectional view of a third illustrative embodiment of a hopper.

The hopper depicted in FIG. 5 includes a tube 28 and a slide 29 which is equipped with a number of chambers 30. These chambers may, for example, be in the form of holes at right angles to the long axis of the slide. The end of the tube 28, away from the wall of the apparatus, is provided with an exit port 31 which opens into the outlet conduit 18. A loading port 37 is provided on its upper side through which the dopant pellets 16 are introduced into the chambers 30. The slide 29 passes outward through a seal in the wall 1, and is actuated in accordance with a time program.

Figure 6:
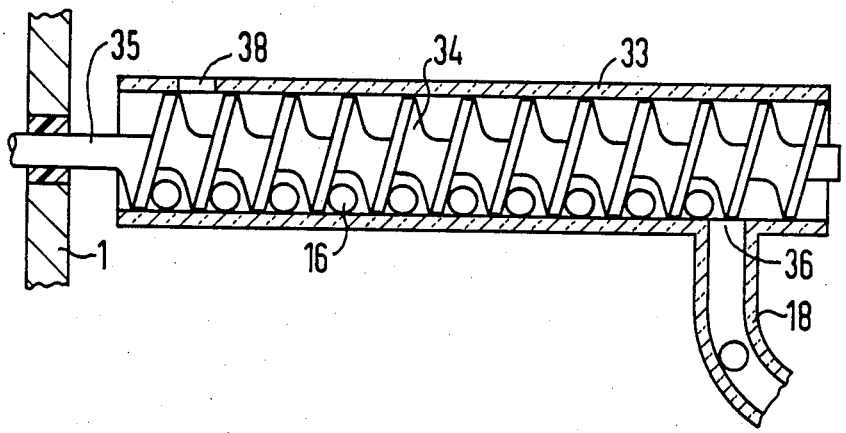
FIG. 6 is a cross-sectional view of a fourth illustrative embodiment of a hopper.

An alternate version of the hopper is illustrated in FIG. 6 comprising a tube 33 wherein an internally arranged worm conveyer 34 is disposed. Space is available between the passes of the worm forming chambers for one of dopant pellets 16. The upper side of the tube 33 is provided with a loading port through which the dopant pellets are introduced into the worm conveyer. A shaft 35, passing through a gas tight seal in the wall 1 of the apparatus, serves as a drive. The end of the tube opposite the wall 1 has an exit port 36 which opens into the outlet conduit 18.

Figure 7:
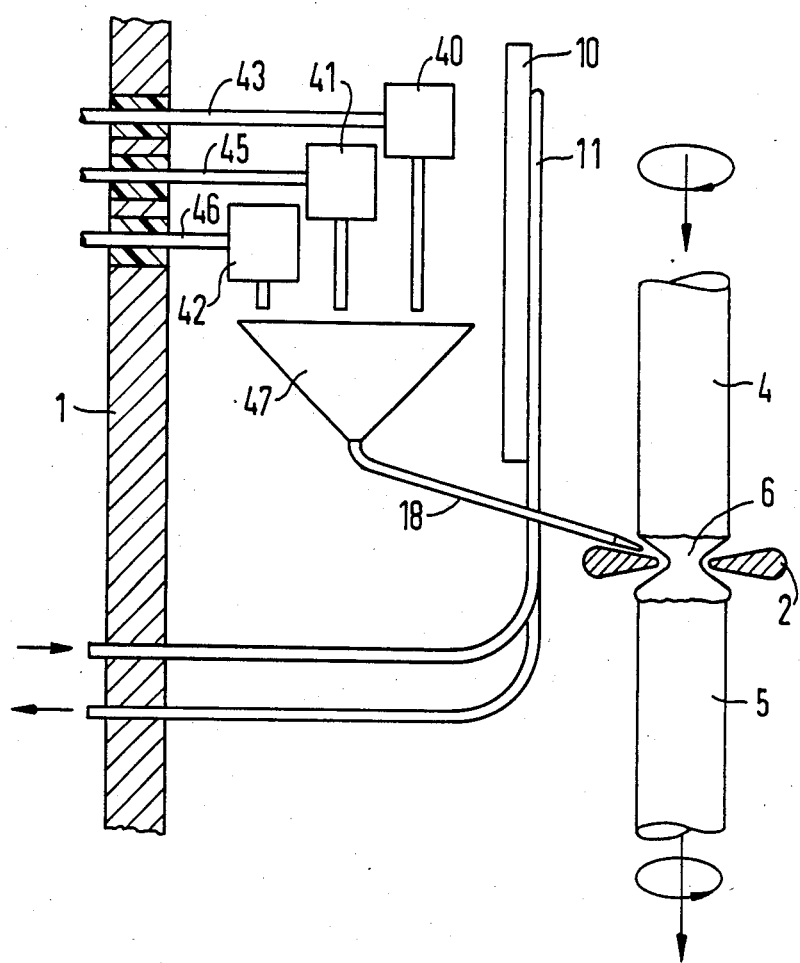
FIG. 7 is an illustrative embodiment depicting a modification from that of FIG. 1 utilizing three hoppers for providing the random feeding of dopant pellets comprised of different substances.

The arrangement depicted in FIG. 7 essentially differs from that illustrated in FIG. 1, in that here, a plurality of hoppers, 40, 41, 42 is provided. These hoppers serve for the introduction of the dopant pellets comprising different doping materials. Similar or equivalent parts are designated with the same reference symbols as used in FIG. 1. The hoppers 40, 41, 42 may in principle be constructed in a manner similar to that of the hoppers shown in FIGS. 2 through 6. They may, however, also be of another design. It is of primary importance that the hoppers be independently and individually operable from the outside, through shafts, push rods, etc., 43, 44, 46. The dopant pellets released from the hoppers then fall through a funnel 47 or through a bifurcated tube, not shown, into the outlet conduit and reach the melt 6.

There has thus been shown and described novel embodiments of apparatus for doping semiconductors material which fulfills all the objects and advantages sought therefor. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

What is claimed is:

1. An arrangement for doping a semiconductor rod, the arrangement comprising an enclosure for the semiconductor rod and the semiconductor rod having a crucible-free, localized float-zone, dopant pellets are introduced to the float-zone, the arrangement having at least one hopper for introducing the dopant pellets, the hopper having an exit port connected to an outlet conduit directed at the float-zone, the hopper is mounted on the inside of said enclosure, and means for operating the hopper from the outside of said enclosure.

2. An arrangement according to claim 1, wherein a plurality of hoppers for the introduction of dopant pellets, comprising different doping materials, are located inside the enclosure.

3. An arrangement according to claim 1, wherein the hopper includes a chambered wheel having chambers along its perimeter, and a casing encloses the chambered wheel, and the chambered wheel is disposed in a vertical orientation and includes a drive shaft extending gas tight through the wall of the enclosure, and the exit port is located at least approximately at the lowest point of the housing.

4. An arrangement according to claim 3, wherein a plurality of hoppers for the introduction of dopant pellets, comprising different doping materials, are each located inside the enclosure.

5. An arrangement according to claim 3, wherein the casing of the chambered wheel includes means for cooling to dissipate the heat absorbed by radiation from the localized float-zone.

6. A crucible free arrangement for doping a semiconductor rod, the arrangement including a housing wherein the semiconductor rod is located and has a localized melt-zone and dopant pellets are introduced to the melt-zone, the arrangement having at least one hopper for introducing the dopant pellets, the hopper having an exit port connected to an outlet conduit directed at the melt-zone, and the hopper is mounted on the inside of said housing and operable from the outside of said housing, the hopper includes at least one tube having an exit port on its lower side, the tube is fitted with a push-rod extending outside of the housing and controlled from outside of the housing, the push-rod having a plurality of chambers open to the tube for the introduction of the dopant pellets, and each dopant pellet is made to communicate individually with the exit port by mechanical displacement of the slide.

7. An arrangement for doping a semiconductor rod, the arrangement including a housing wherein the semiconductor rod is located and having a crucible-free, float-zone and dopant pellets are supplied to the localized float-zone, the arrangement having at least one hopper for introducing the dopant pellets, the hopper having an exit port connected to an outlet conduit directed at the float-zone, and the hopper is mounted on the inside of said enclosure and includes a control operable from the outside of said enclosure, the hopper including a funnel having an aperture communicating with a horizontally slanting tube, and the control having a movable piston closing the lower end of the slanting tube and an exit port is located in the vicinity of the upper end of the tube.

8. An arrangement according to claim 6, wherein each hopper is connected with a common outlet conduit.

9. An arrangement for doping a semiconductor rod, the arrangement including a housing wherein the semiconductor rod is located and has a crucible-free, float-zone and dopant pellets are supplied to the localized float-zone, the arrangement having at least one hopper for introducing the dopant pellets, the hopper having an exit port connected to an outlet conduit directed at the float-zone, the hopper is mounted on the inside of said enclosure, and means for operating the hopper from the outside of said enclosure, and a heat protective shield is disposed between each hopper and the semiconductor rod.

10. An arrangement according to claim 1, further comprises an induction heating coil having an aperture and the outlet conduit passes through the aperture of the induction heating coil.

11. An arrangement according to claim 1, wherein the hopper includes a worm conveyor, housed in a tube, and that the exit port is located at the bottom of the tube.

12. An arrangement according to claim 10, wherein the outlet conduit is lead to a groove on the coil sloping radially towards the inside.

* * * * *